(12) United States Patent
Liang et al.

(10) Patent No.: US 9,263,437 B2
(45) Date of Patent: Feb. 16, 2016

(54) MECHANISMS FOR FORMING METAL-INSULATOR-METAL (MIM) CAPACITOR STRUCTURE

(71) Applicant: Taiwan Semiconductor Manufacturing Co., Ltd., Hsin-Chu (TW)

(72) Inventors: Chieh-Shuo Liang, Kaohsiung (TW); Hsing-Chih Lin, Tainan (TW); Yu-Lung Yeh, Kaohsiung (TW); Chih-Ho Tai, Tainan (TW); Ching-Hung Huang, Erlin Township (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 47 days.

(21) Appl. No.: 14/133,037

(22) Filed: Dec. 18, 2013

(65) Prior Publication Data

US 2015/0171207 A1    Jun. 18, 2015

(51) Int. Cl.
*H01L 29/78* (2006.01)
*H01L 27/06* (2006.01)
*H01L 23/522* (2006.01)
*H01L 49/02* (2006.01)
*H01L 23/532* (2006.01)

(52) U.S. Cl.
CPC ........ *H01L 27/0688* (2013.01); *H01L 23/5223* (2013.01); *H01L 28/60* (2013.01); *H01L 23/53223* (2013.01); *H01L 23/53238* (2013.01); *H01L 23/53266* (2013.01); *H01L 2924/0002* (2013.01)

(58) Field of Classification Search
CPC ... H01L 29/78; H01L 28/40; H01L 27/10852; H01L 27/10894; H01L 27/105; H01L 27/10814; H01L 27/10888
USPC ............................................ 257/296
See application file for complete search history.

(56) References Cited

U.S. PATENT DOCUMENTS 7,241,695 B2    7/2007  Mattew et al.
2009/0085156 A1*  4/2009  Dewey et al. ............... 257/532

* cited by examiner

*Primary Examiner* — Monica D Harrison
(74) *Attorney, Agent, or Firm* — Birch, Stewart, Kolasch & Birch, LLP (57) ABSTRACT

Embodiments of mechanisms for forming a metal-insulator-metal (MIM) capacitor structure are provided. The metal-insulator-metal capacitor structure includes a substrate. The MIM capacitor structure also includes a CBM layer formed on the substrate, and the CBM layer includes a bottom barrier layer, a main metal layer and a top barrier layer. The MIM capacitor structure further includes a first high-k dielectric layer formed on the CBM layer, an insulating layer formed on the first high-k dielectric layer and a second high-k dielectric layer formed on the insulating layer. The MIM capacitor structure also includes a CTM layer formed on the second high-k dielectric layer, and the CBM layer includes a bottom barrier layer, a main metal layer and a top barrier layer.

20 Claims, 6 Drawing Sheets

MECHANISMS FOR FORMING METAL-INSULATOR-METAL (MIM) CAPACITOR STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of capacitor is a metal-insulator-metal (MIM) capacitor, which is used in mixed signal devices and logic devices, such as embedded memories and radio frequency devices. MIM capacitors are used to store a charge in a variety of semiconductor devices. A MIM capacitor is formed horizontally on a semiconductor wafer, with two metal plates sandwiching a dielectric layer parallel to the wafer surface. However, there are many challenges related to the MIM capacitor.

BRIEF DESCRIPTION OF THE DRAWINGS

For a more complete understanding of the present disclosure, and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1:
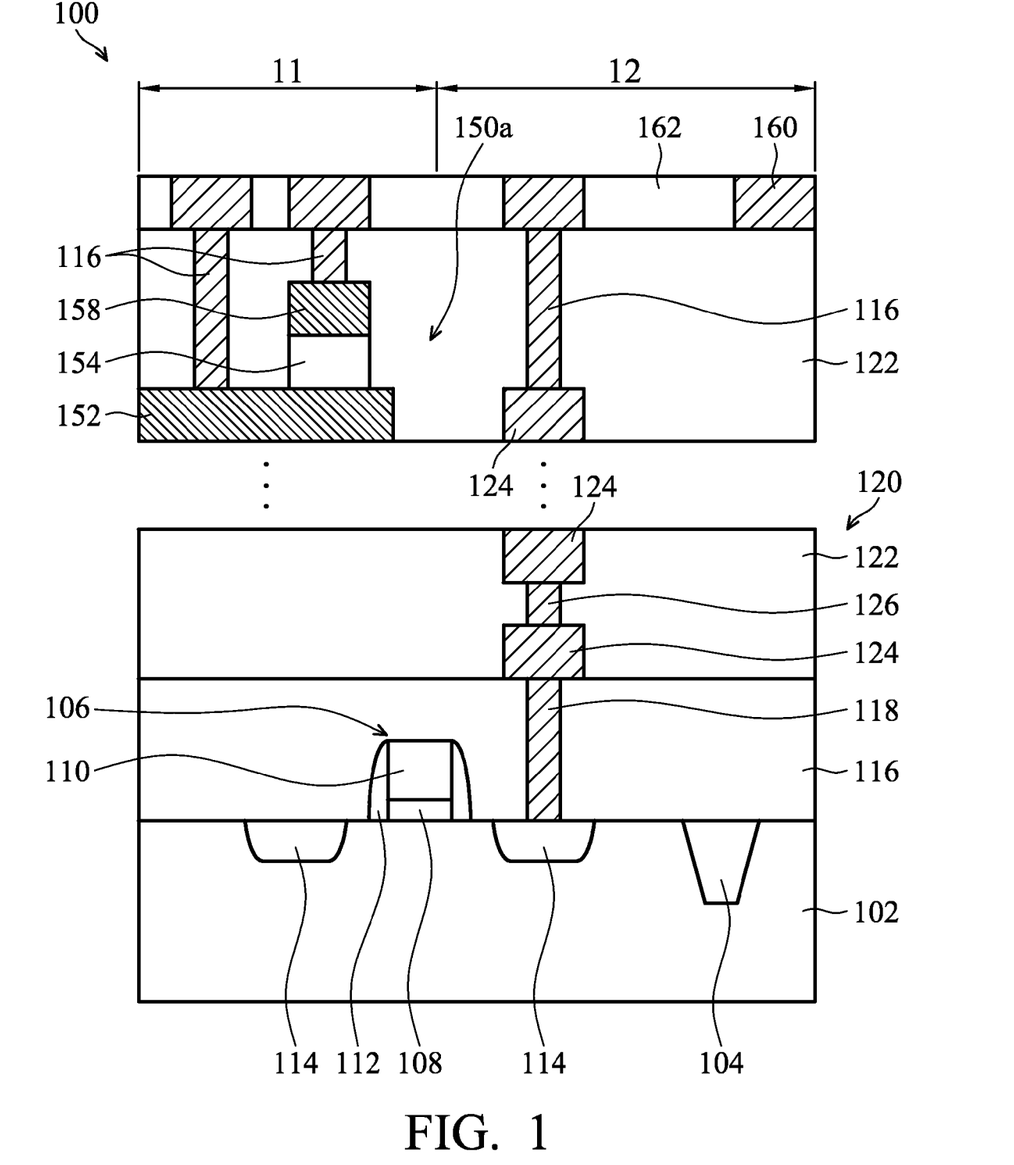
FIG. 1 shows a cross-sectional representation of a semiconductor device structure, in accordance with some embodiments of the disclosure.

Embodiments of mechanisms for forming a metal-insulator-metal (MIM) capacitor structure are provided. FIG. 1 shows a cross-sectional representation of a semiconductor device structure 100, in accordance with some embodiments of the disclosure. Semiconductor device structure 100 includes a metal-insulator-metal (MIM) capacitor structure 150a.

As shown in FIG. 1, a substrate 102 is provided. Substrate 102 includes a MIM region 11 and a non-MIM region 12. Substrate 102 may be made of silicon or other semiconductor materials. Alternatively or additionally, substrate 102 may include other elementary semiconductor materials such as germanium. In some embodiments, substrate 102 is made of a compound semiconductor such as silicon carbide, gallium arsenic, indium arsenide, or indium phosphide. In some embodiments, substrate 102 is made of an alloy semiconductor such as silicon germanium, silicon germanium carbide, gallium arsenic phosphide, or gallium indium phosphide. In some embodiments, substrate 102 includes an epitaxial layer. For example, substrate 102 has an epitaxial layer overlying a bulk semiconductor.

Substrate 102 may further include isolation features 104, such as shallow trench isolation (STI) features or local oxidation of silicon (LOCOS) features. The isolation features may define and isolate various integrated circuit devices. Integrated circuit devices, such as metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, or other suitable elements, are formed in and/or on substrate 102.

As shown in FIG. 1, a gate stack 106 is formed on substrate 102. Gate stack 106 includes a gate dielectric layer 108, a gate electrode layer 110 formed on gate dielectric layer 108. Gate dielectric layer 108 is made of silicon oxide, silicon nitride, or a high dielectric constant material (high-k material). Gate electrode layer 110 is made of polysilicon or metal material. Gate spacers 112 are formed on sidewalls of gate stack 106. In some embodiments, gate spacers 112 are made of silicon oxide, silicon nitride, and/or silicon oxynitride.

Source/drain regions 114 are formed in substrate 102. An inter-layer dielectric (ILD) layer 116 is formed on substrate 102, and a contact structure 118 is formed in ILD layer 116. Contact structures 118 are formed in ILD layer 116 and in contact with source/drain regions 114. Contact structures 118 are made of conductive materials, such as copper, or copper alloy.

As shown in FIG. 1, an interconnect structure 120 is formed over substrate 102. In some embodiments, interconnect structure 120 including metal lines 124 and vias 126 is embedded in inter-metal dielectric (IMD) layers 122. In some embodiments, interconnect structure 120 is formed in a back-end-of-line (BEOL) process. Metal lines 124 and vias 126 may be made of a conductive material, such as copper (Cu), aluminum (Al), tungsten (W), or other applicable materials. In some embodiments, metal lines 124 and vias 126 are copper or copper alloy. In some embodiments, metal lines 124 and vias 126 are formed by single and/or dual damascene processes. Metal lines 124 include multiple metal layers (namely M1, M2, M3 . . . , and Mtop) which are interconnected through vias 126.

In some embodiments, inter-metal dielectric (IMD) layers 122 are made of silicon oxide. In some other embodiments, IMD layers 122 are made of un-doped silicate glass (USG), fluorinated silicate glass (FSG), carbon-doped silicate glass, silicon nitride or silicon oxynitride. In some embodiments, IMD layers 122 include multiple dielectric layers. One or more of the multiple dielectric layers are made of low dielectric constant (low-k) materials, such as a dielectric constant of less than about 3.0, or less than about 2.5. Interconnect structure 120 shown in FIG. 1 is merely for illustrative purposes. Interconnect structure 120 may include other configurations and may include one or more metal lines and IMD layers.

As shown in FIG. 1, an MIM capacitor structure 150a is formed over substrate 102 in MIM region 11. MIM capacitor structure 150a is a sandwich structure and an insulating layer 154 is formed between a capacitor bottom metal (CBM) layer 152 and a capacitor top metal (CTM) layer 158.

As shown in FIG. 1, in MIM region 11, one of vias 116 is formed in IMD layer 122 to electrically connect CBM layer 152, and one of vias 116 is formed in IMD layer 122 to electrically connect CTM layer 158. In the non-MIM region, one of vias 116 is formed in IMD layer 122 to electrically connect metal line 124. A top metal layer 160 (also called $M_{top}$) is formed over vias 116 and in a top IMD layer 162. Top metal layer 160 is furthest away from the first metal layer $M_1$.

Figure 2:
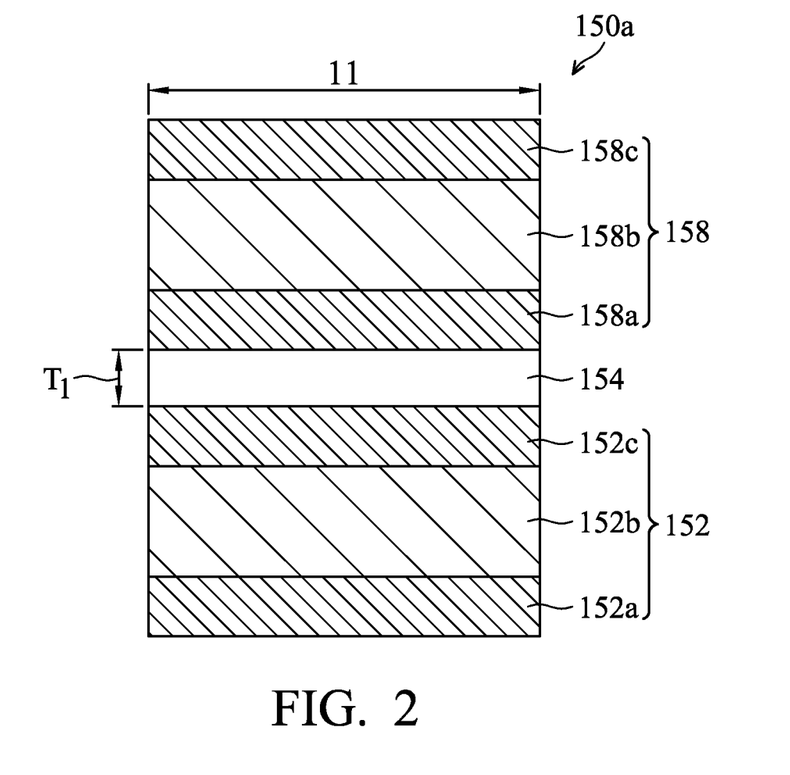
FIG. 2 shows a cross-sectional representation of a metal-insulator-metal (MIM) capacitor structure, in accordance with some embodiments of the disclosure.

FIG. 2 shows a cross-sectional representation of metal-insulator-metal (MIM) capacitor structure 150a, in accordance with some embodiments of the disclosure.

As shown in FIG. 2, CBM layer 152 includes a bottom barrier layer 152a, a main metal layer 152b and a top barrier layer 152c. Bottom barrier layer 152a and top barrier layer 152c are used as anti-oxidation layer to protect main metal layer 152b from being oxidized. In addition, top barrier layer 152c is used as an adhesion layer to improve the adhesion between main metal layer 152b and insulating layer 154. Bottom barrier layer 152a and top barrier layer 152c independently include titanium (Ti), titanium nitride (TiN), tantalum (Ta), or tantalum nitride (TaN). In some embodiments, main metal layer 152b is made of copper (Cu), copper alloy, aluminum (Al), aluminum (Al) alloy, copper aluminum alloy (AlCu), tungsten (W) or tungsten (W) alloy.

CBM layer 152 is formed by a procedure including depositing, photolithography, and etching processes. The deposition processes include chemical vapor deposition (CVD), physical vapor deposition (PVD), atomic layer deposition (ALD), or applicable methods. The photolithography processes include photoresist coating (e.g., spin-on coating), soft baking, mask aligning, exposure, post-exposure baking, developing the photoresist, rinsing, and drying (e.g., hard baking). The etching processes include dry etching, wet etching, and/or other etching methods.

Insulating layer 154 is made of dielectric materials, such as silicon oxide, silicon nitride or silicon glass. In some embodiments, insulating layer 154 is formed by a chemical vapor deposition (CVD) or physical vapor deposition (PVD). In some embodiments, insulating layer 154 has a thickness $T_1$ in a range from about 7 angstrom to about 10000 angstrom.

In addition, CTM layer 158 includes a bottom barrier layer 158a, a main metal layer 158b and a top barrier layer 158c. The material and fabrication method of bottom barrier layer 158a, a main metal layer 158b and a top barrier layer 158c are like these of bottom barrier layer 152a, main metal layer 152b and top barrier layer 152c, respectively.

The capacitance of capacitor structure 150a is calculated by following Equation (I). From the Equation (I), the capacitance of MIM capacitor structure 150a is proportional to K value and inversely proportional to d value.

$$C(\text{capacitance}) = K \in_0 A / d \quad \text{Equation (I)}$$

$\in_0$: the permittivity of free space;
K: the relative dielectric constant of insulating layer 154;
A: the area of overlap of the two plates (CBM layer 152 and CTM layer 158);
d: the thickness $T_1$ of insulating layer 154.

In addition, the maximum energy that can be stored safely in MIM capacitor structure 150a is limited by the breakdown voltage. Especially for a high-voltage device, breakdown voltage is a main factor affecting the performance of MIM capacitor structure 150a. In addition, the breakdown voltage is proportional to the thickness $T_1$ of insulating layer 154.

In some embodiments, in order to increase the breakdown voltage of MIM capacitor structure 150a, the thickness $T_1$ of the insulating layer is increased. However, if the K value and A value are constant, the capacitance of MIM capacitor structure 150a is decreased when thickness $T_1$ of insulating layer 154 is increased according to Equation (I). In order to maintain the same capacitance value of MIM capacitor structure 150a, the K value is increased along with increase in thickness $T_1$ of insulating layer 154. Therefore, in some embodiments, insulating layer 154 with a high-k dielectric layer is provided.

Figure 3A:
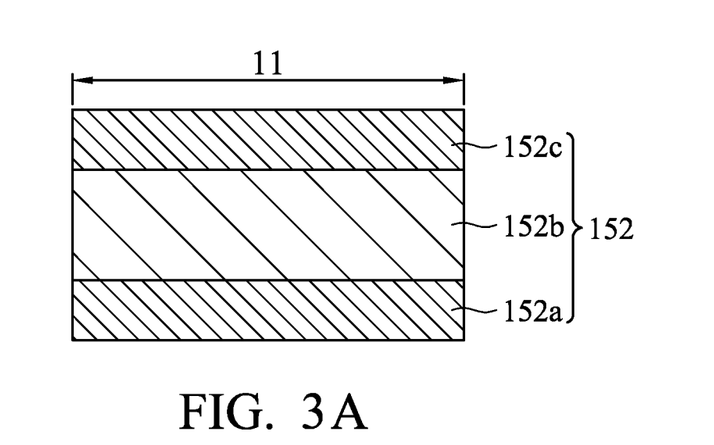
FIGS. 3A-3C show cross-sectional representations of various stages of forming a metal-insulator-metal (MIM) capacitor structure, in accordance with some embodiments of the disclosure.
Figure 3B:
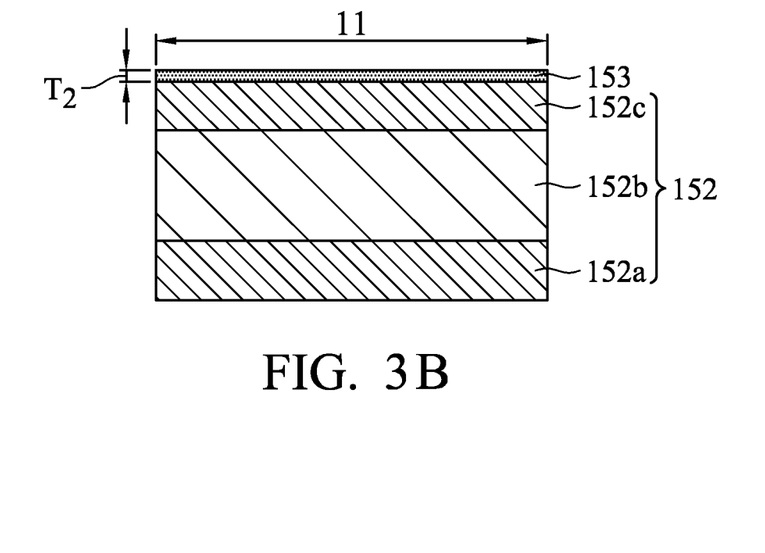
Figure 3C:
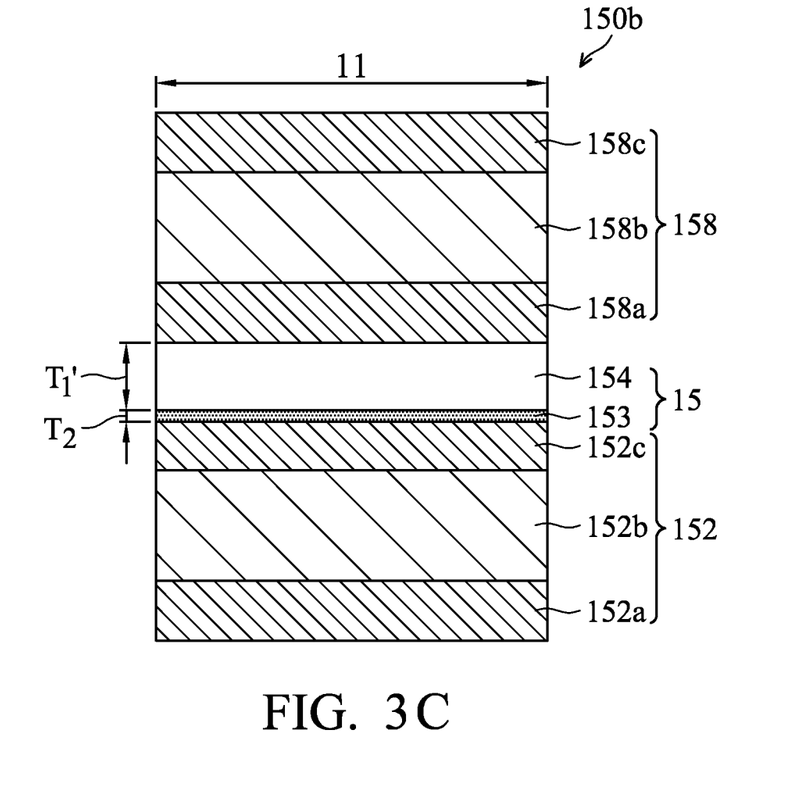

FIGS. 3A-3C show cross-sectional representations of various stages of forming a metal-insulator-metal (MIM) capacitor structure 150b, in accordance with some embodiments of the disclosure.

As shown in FIG. 3A, in MIM region 11, CBM layer 152 includes bottom barrier layer 152a, main metal layer 152b and top barrier layer 152c.

After CBM layer 152 is formed, a high-k dielectric layer 153 is formed on top barrier layer 152c as shown in FIG. 3B in accordance with some embodiments of the disclosure. In some embodiments, high-k dielectric layer 153 is made of titanium oxide ($Ti_xO_y$, x is a real number and y is a real number), tantalum oxide ($Ta_xO_y$, x is a real number and y is a real number), titanium oxide nitride ($Ti_xO_yN_z$, x is a real number, y is a real number and z is a real number) or tantalum oxide Nitride ($Ta_xO_yN_x$, x is a real number, y is a real number and z is a real number). In some embodiments, high-k dielectric layer 153 has a relative dielectric constant (the K value) in a range from 4 to about 400. In some embodiments, high-k dielectric layer 153 has a thickness $T_2$ in a range from about 5 angstrom to about 50 angstrom.

High-k dielectric layer 153 is formed by treating a surface of top barrier layer 152c of CBM layer 152. The treating is performed by implanting or supplying oxygen ions to a surface of top barrier layer 152c of CBM layer 152. In some embodiments, the treating method includes a plasma ionization method, microwave surface downstream ionization method, or furnace/rapid thermal annealing (RTA) method.

In some embodiments, when the plasma ionization method is used, plasma with nitrous oxide ($N_2O$), water ($H_2O$), nitric oxide (NO) or oxygen ($O_2$) is used to oxidize top barrier layer 152c to form high-k dielectric layer 153. In some embodiments, the plasma ionization method is performed at a pressure in a range from about 0.1 μtorr to about 1000 torr.

In some embodiments, when the microwave surface downstream ionization method is used, a process gas including nitrous oxide ($N_2O$), water ($H_2O$), nitric oxide (NO) or oxygen ($O_2$) is used. In some embodiments, the power of the microwave is in a range from about 10 W to about 10000 W. In some embodiments, the frequency of the microwave is in a range from about 1 MHz to about 100 GHz.

In some embodiments, when the furnace/rapid thermal annealing (RTA) method is used, a process gas including nitrous oxide ($N_2O$), water ($H_2O$), nitric oxide (NO), oxygen ($O_2$) or ozone ($O_3$) is used. In some embodiments, the temperature used in the furnace/rapid thermal annealing (RTA) method is in a range from about 100° C. to about 1200° C. In some embodiments, the operation time used in furnace/rapid thermal annealing (RTA) method is in a range from about 1 s to about 1000 s.

After high-k dielectric layer 153 is formed, insulating layer 154 is formed on high-k dielectric layer 153 as shown in FIG. 3C in accordance with some embodiments of the disclosure. An insulator 15 of MIM capacitor structure 150b is constructed by insulating layer 154 and high-k dielectric layer 153.

It should be noted that, when the capacitance of MIM capacitor structure 150b is the same as that of MIM capacitor structure 150a, the relative dielectric constant (the K value) of insulator 15 is increased by adding high-k dielectric layer 153, and therefore the thickness of insulator 15 is increased. In some embodiments, a sum of the thickness $T_1'$ of insulating layer 154 and the thickness $T_2$ of high-k dielectric layer 153 is in a range from about 12 angstrom to about 10050 angstrom.

When the thickness of insulator 15 (or insulating layer 154) is increased, the process window for forming insulator 15 (or insulating layer 154) is improved. In addition, once the thickness of insulator 15 is increased, the breakdown voltage of MIM capacitor structure 150b is improved without reducing capacitance.

FIGS. 4A-4E shows a cross-sectional representation of forming a metal-insulator-metal (MIM) capacitor structure, in accordance with some embodiments of the disclosure.

Figure 4A:
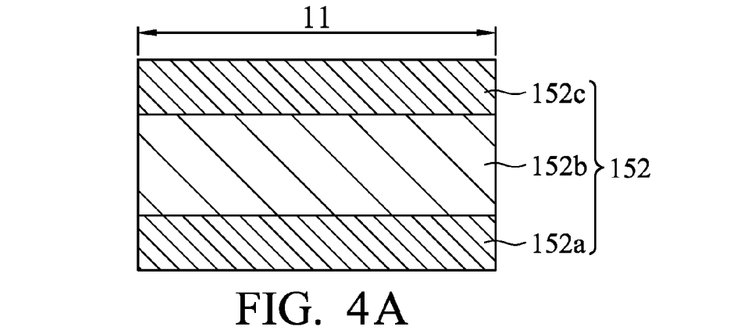
FIGS. 4A-4E shows a cross-sectional representation of forming a metal-insulator-metal (MIM) capacitor structure, in accordance with some embodiments of the disclosure.

As shown in FIG. 4A, CBM layer 152 includes bottom barrier layer 152a, main metal layer 152b and top barrier layer 152c.

Figure 4B:
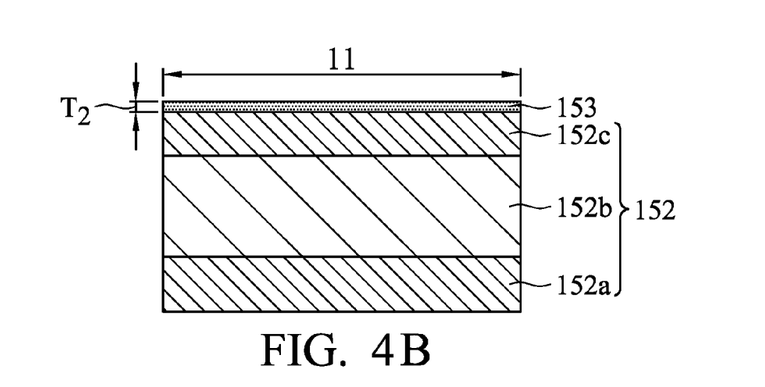

After CBM layer 152 is formed, high-k dielectric layer 153 is formed on top barrier layer 152c as shown in FIG. 4B in accordance with some embodiments of the disclosure. The fabricating method of high-k dielectric layer 153 in FIG. 4B is the same as that in FIG. 3B.

Figure 4C:
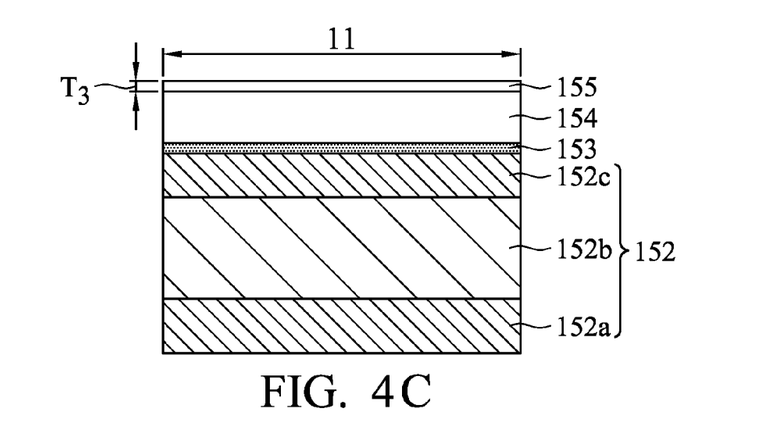

After high-k dielectric layer 153 is formed, insulating layer 154 is formed on high-k dielectric layer 153 as shown in FIG. 4C in accordance with some embodiments of the disclosure. Afterwards, a barrier layer 155 is formed on insulating layer 154. In some embodiments, barrier layer 155 is made of titanium (Ti), titanium nitride (TiN), tantalum (Ta), or tantalum nitride (TaN).

In some embodiments, barrier layer 155 has a thickness $T_3$ is in a range from about 5 angstrom to about 50 angstrom. If the thickness $T_3$ of barrier layer 155 is too thick, barrier layer 155 may be oxidized insufficiently later. Therefore, an un-oxidated barrier layer may be formed between high-k dielectric layer 157 (formed afterwards, shown in FIG. 4D) and insulating layer 154. If the thickness $T_3$ of barrier layer 155 is too thin, it is hard to enhance the breakdown voltage.

Figure 4D:
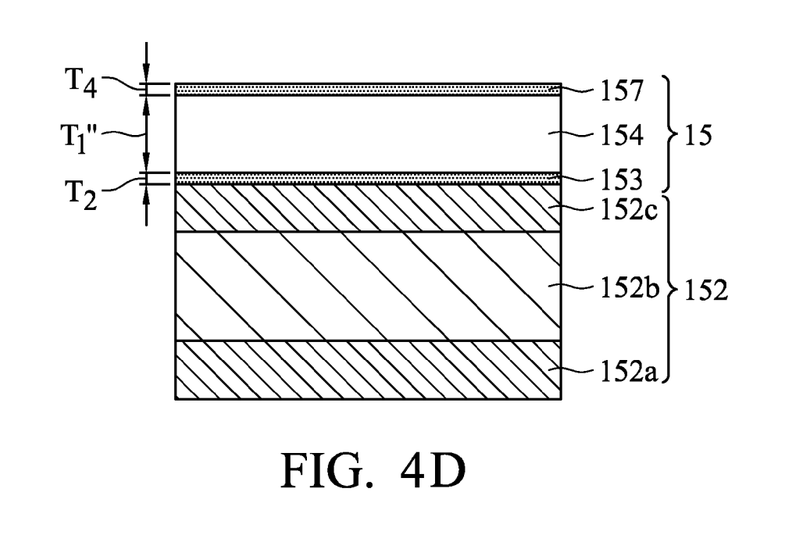

After barrier layer 155 is formed, a second high-k dielectric layer 157 is formed on insulating layer 154 as shown in FIG. 4D in accordance with some embodiments of the disclosure. In some embodiments, second high-k dielectric layer 157 has a relative dielectric constant (the K value) in a range from about 4 to about 400. In some embodiments, second high-k dielectric layer 157 has a thickness $T_4$ in a range from about 5 angstrom to about 50 angstrom.

Second high-k dielectric layer 157 is formed by treating a surface of barrier layer 155. The treatment is performed by implanting or supplying oxygen ions to a surface of barrier layer 155. In some embodiments, the treatment method includes a plasma ionization method, microwave surface downstream ionization method, or furnace/rapid thermal annealing (RTA) method.

In some embodiments, when the plasma ionization method is used, plasma with nitrous oxide ($N_2O$), water ($H_2O$), or nitric oxide (NO), oxygen (O2) or ozone ($O_3$) is used to oxidize barrier layer 155. In some embodiments, the plasma ionization method is performed at a pressure in a range from about 0.1 μtorr to about 1000 torr.

In some embodiments, when the microwave surface downstream ionization method is used, a process gas including nitrous oxide ($N_2O$), water ($H_2O$), or nitric oxide (NO), oxygen ($O_2$) or ozone ($O_3$) is used. In some embodiments, the power of the microwave is in a range from about 10 W to about 10000 W. In some embodiments, the frequency of the microwave is in a range from 1 MHZ to about 1000 MHZ.

In some embodiments, when the furnace/rapid thermal annealing (RTA) method is used, a process gas includes nitrous oxide ($N_2O$), water ($H_2O$), or nitric oxide (NO), oxygen ($O_2$) or ozone ($O_3$) is used. In some embodiments, the temperature used in furnace/rapid thermal annealing (RTA) method is in a range from about 100° C. to about 1200° C. In some embodiments, the operation time used in the furnace/rapid thermal annealing (RTA) method is in a range from about 1 s to about 1000 s.

As shown in FIG. 4D, insulator 15 is constructed by first high-k dielectric layer 153, insulating layer 154 and second high-k dielectric layer 157. In some embodiments, a sum of the thickness $T_1''$ of insulating layer 154, the thickness $T_2$ of high-k dielectric layer 153 and the thickness $T_4$ of second high-k dielectric layer 157 is in a range from about 17 angstrom to about 10100 angstrom.

Figure 4E:
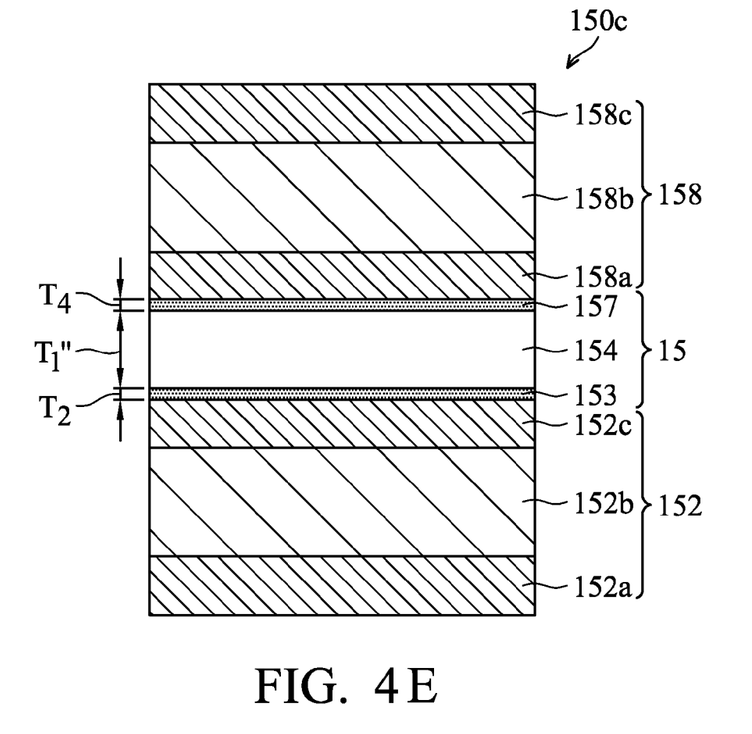

After second high-k dielectric layer 157 is formed, CTM layer 158 is formed on second high-k dielectric layer 157 as shown in FIG. 4E in accordance with some embodiments of the disclosure. CTM layer 158 includes a bottom barrier layer 158a, main metal layer 158b and top barrier layer 158c. After CTM layer 158 is formed, a MIM capacitor structure 150c is obtained.

It should be noted that the relative dielectric constant (the K value) of insulator 15 is increased by adding high-k dielectric layer 153 and second high-k dielectric layer 157, and therefore the thickness of insulator 15 is increased.

When the sum of the thickness of insulator 15 (or insulating layer 154) is increased, the process window for forming insulator 15 (or insulating layer 154) is improved. In addition, once the sum of the thickness of insulator 15 is increased, the breakdown voltage of MIM capacitor structure 150c is further improved without reducing capacitance.

Figure 5:
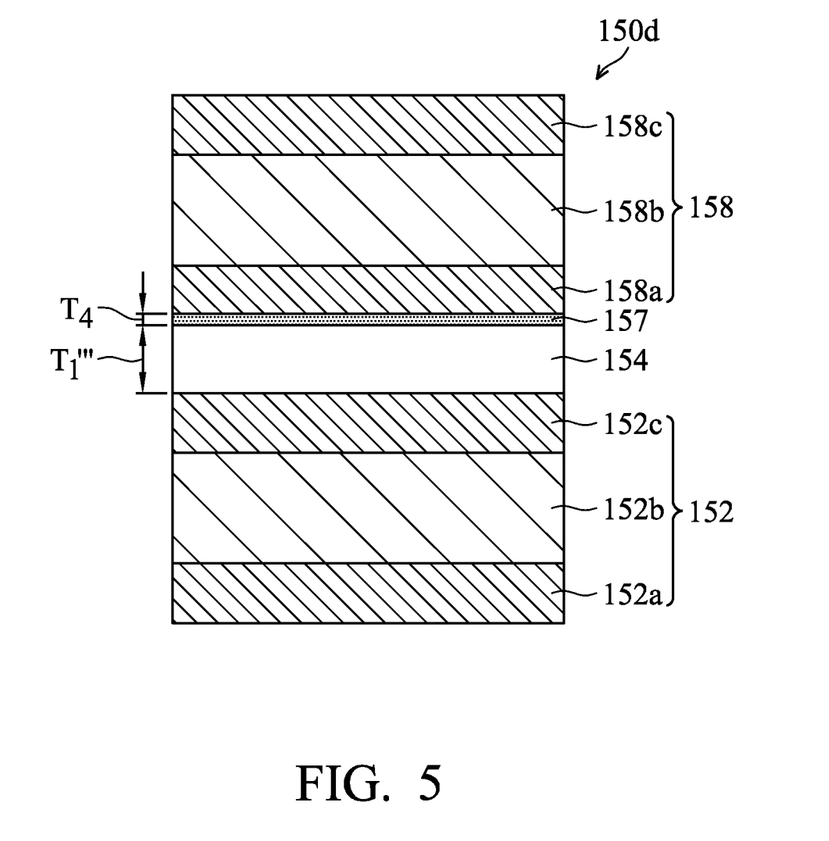
FIG. 5 shows a cross-sectional representation of a metal-insulator-metal (MIM) capacitor structure, in accordance with some embodiments of the disclosure.

FIG. 5 shows a cross-sectional representation of a metal-insulator-metal (MIM) capacitor structure 150d, in accordance with some embodiments of the disclosure. FIG. 5 is similar to FIG. 4E, with the difference between FIG. 5 and FIG. 4F being that no high-k dielectric layer 153 is formed in FIG. 5.

As shown in FIG. 5, MIM capacitor structure 150d is formed with second high-k dielectric layer 157. Insulator 15 is constructed by insulating layer 154 and second high-k dielectric layer 157. In some embodiments, the sum of the thickness $T_1'''$ of insulating layer 154 and the thickness $T_4$ of second high-k dielectric layer 157 is in a range from about 12 angstrom to about 10050 angstrom.

The advantage for forming second high-k dielectric layer 157 is to increase the relative dielectric constant (the K value) of MIM capacitor structure 150d. Therefore, the thickness of insulator 15 is increased along with the increased K value, and breakdown voltage is improved. Furthermore, the process window for forming insulator 15 (or insulating layer 154) is improved.

Embodiments of mechanisms for forming a metal-insulator-metal (MIM) capacitor structure are provided. The MIM capacitor structure is made of a CBM layer, a main metal layer and a CTM layer. The insulating layer includes a high-k dielectric layer, and/or a second high-k dielectric layer. A first high-k dielectric layer is formed on the CBM layer and the insulating layer. A second high-k dielectric layer is formed on the insulating layer and the CTM layer. The high-k dielectric layer is used to improve the K value of MIM capacitor structure. Once the K value is increased, the thickness of the insulating layer is also increased without reducing the capacitance. Therefore, breakdown voltage is improved and the process window for forming the insulating layer is improved.

In some embodiments, a device is provided. The device includes a substrate and a metal-insulator-metal (MIM) capacitor formed on the substrate. The MIM capacitor also includes a capacitor top metal (CTM) layer, a capacitor bottom metal (CBM) layer and an insulator formed between the CTM layer and the CBM layer. The insulator includes an insulating layer and a first high-k dielectric layer, and the first high-k dielectric layer is formed between the CBM layer and the insulating layer, or between the CTM layer and the insulating layer.

In some embodiments, a metal-insulator-metal (MIM) capacitor structure is provided. The metal-insulator-metal capacitor structure includes a substrate. The MIM capacitor structure also includes a CBM layer formed on the substrate, and the CBM layer includes a bottom barrier layer, a main metal layer and a top barrier layer. The MIM capacitor structure further includes a first high-k dielectric layer formed on the CBM layer, an insulating layer formed on the first high-k dielectric layer and a second high-k dielectric layer formed on the insulating layer. The MIM capacitor structure also includes a CTM layer formed on the second high-k dielectric layer, and the CBM layer includes a bottom barrier layer, a main metal layer and a top barrier layer.

In some embodiments, a method for forming a metal-insulator-metal (MIM) capacitor structure is provided. The method for forming a metal-insulator-metal (MIM) capacitor structure includes providing a substrate. The method for forming a metal-insulator-metal (MIM) capacitor structure also includes forming a capacitor bottom metal (CBM) layer on the substrate, and the CBM layer includes a bottom barrier layer, a main metal layer and a top barrier layer. The method for forming a metal-insulator-metal (MIM) capacitor structure also includes forming a first high-k dielectric layer on the CBM layer, and forming an insulating layer on the first high-k dielectric layer. The method for forming a metal-insulator-metal (MIM) capacitor structure further includes forming a capacitor top metal (CTM) layer on the insulating layer.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device, comprising:
   a substrate; and
   a metal-insulator-metal (MIM) capacitor formed on the substrate,
   wherein the MIM capacitor comprises:
      a capacitor top metal (CTM) layer;
      a capacitor bottom metal (CBM) layer; and
      an insulator formed between the CTM layer and the CBM layer,
   wherein the insulator comprises an insulating layer and a first high-k dielectric layer, and wherein the first high-k dielectric layer is formed between the CBM layer and the insulating layer, or between the CTM layer and the insulating layer, and a thickness of the insulating layer is larger than a thickness of the first high-k dielectric layer.

2. The device as claimed in claim 1, wherein the first high-k dielectric layer has a relative dielectric constant in a range from about 4 to about 400.

3. The device as claimed in claim 1, wherein the first high-k dielectric layer comprises titanium oxide ($Ti_xO_y$, x is a real number and y is a real number), tantalum oxide ($Ta_xO_y$, x is a real number and y is a real number), titanium oxide nitride ($Ti_xO_yN_z$, x is a real number, y is a real number and z is a real number) or tantalum oxide Nitride ($Ta_xO_yN_z$, x is a real number, y is a real number and z is a real number).

4. The device as claimed in claim 1, wherein the thickness of the first high-k dielectric layer is in a range from about 5 angstrom to about 50 angstrom.

5. A device, comprising:
   a substrate; and
   a metal-insulator-metal (MIM) capacitor formed on the substrate, wherein the MIM capacitor comprises:
a capacitor top metal (CTM) layer;
a capacitor bottom metal (CBM) layer; and
an insulator formed between the CTM layer and the CBM layer,
wherein the insulator comprises an insulating layer, a first high-k dielectric layer and a second high-k dielectric layer, and wherein the first high-k dielectric layer is formed between the CBM layer and the insulating layer, or between the CTM layer and the insulating layer.

6. The device as claimed in claim 5, wherein the first high-k dielectric layer and the second high-k dielectric layer are formed on opposite sides of the insulating layer.

7. The device as claimed in claim 5, wherein a sum of the thickness of the first high-k dielectric layer, the thickness of the insulating layer and a thickness of the second high-k dielectric layer is a range from about 17 angstrom to about 10010 angstrom.

8. A device, comprising:
a substrate; and
a metal-insulator-metal (MIM) capacitor formed on the substrate,
wherein the MIM capacitor comprises:
a capacitor top metal (CTM) layer;
a capacitor bottom metal (CBM) layer; and
an insulator formed between the CTM layer and the CBM layer,
wherein the insulator comprises an insulating layer and a first high-k dielectric layer, and wherein the first high-k dielectric layer is formed between the CBM layer and the insulating layer, or between the CTM layer and the insulating layer, and
wherein the CBM layer comprises a bottom barrier layer, a main metal layer and a top barrier layer, and wherein the bottom barrier layer and the top barrier layer are formed on opposite sides of the main metal layer.

9. The device as claimed in claim 8, wherein the first high-k dielectric layer is formed between the top barrier layer of the CBM layer and the insulating layer.

10. The device as claimed in claim 8, wherein the bottom barrier layer and the top barrier layer independently comprise titanium (Ti), titanium nitride (TiN), tantalum (Ta), or tantalum nitride (TaN).

11. The device as claimed in claim 8, wherein the main metal layer comprises copper (Cu), copper alloy, aluminum (Al), aluminum (Al) alloy, copper aluminum alloy (AlCu), tungsten (W) or tungsten (W) alloy.

12. A metal-insulator-metal capacitor structure, comprising:
a CBM layer formed on a substrate, wherein the CBM layer comprises a bottom barrier layer, a main metal layer and a top barrier layer;
a first high-k dielectric layer formed on the CBM layer;
an insulating layer formed on the first high-k dielectric layer;
a second high-k dielectric layer formed on the insulating layer; and
a CTM layer formed on the second high-k dielectric layer, wherein the CBM layer comprises a bottom barrier layer, a main metal layer and a top barrier layer.

13. The metal-insulator-metal capacitor structure as claimed in claim 12, wherein the first high-k dielectric layer and the second high-k dielectric layer independently comprises titanium oxide ($Ti_xO_y$, x is a real number and y is a real number), tantalum oxide ($Ta_xO_y$, x is a real number and y is a real number), titanium oxide nitride ($Ti_xO_yN_z$, x is a real number, y is a real number and z is a real number) or tantalum oxide Nitride ($Ta_xO_yN_z$, x is a real number, y is a real number and z is a real number).

14. The metal-insulator-metal capacitor structure as claimed in claim 12, wherein the first high-k dielectric layer has a relative dielectric constant in a range from about 4 to about 400.

15. The metal-insulator-metal capacitor structure as claimed in claim 12, wherein the first high-k dielectric layer has a thickness in a range from about 5 angstrom to about 50 angstrom.

16. The metal-insulator-metal capacitor structure as claimed in claim 12, wherein a sum of a thickness of the insulating layer, a thickness of the first high-k dielectric layer and a thickness of the second high-k dielectric layer is in a range from about 17 angstrom to about 10100 angstrom.

17. A method for forming a metal-insulator-metal capacitor structure, comprising:
providing a substrate;
forming a capacitor bottom metal (CBM) layer on the substrate, wherein the CBM layer comprises a bottom barrier layer, a main metal layer and a top barrier layer;
forming a first high-k dielectric layer on the CBM layer;
forming an insulating layer on the first high-k dielectric layer; and
forming a capacitor top metal (CTM) layer on the insulating layer.

18. The method as claimed in claim 17, wherein forming the first high-k dielectric layer on the CBM layer comprises:
treating a surface of the top barrier layer of the CBM layer.

19. The method as claimed in claim 18, wherein treating the surface of the top barrier layer of the CBM layer is performed by a plasma ionization method, microwave surface downstream ionization method, or furnace/rapid thermal annealing (RTA) method.

20. The method as claimed in claim 17, before forming the CTM layer, further comprising:
forming a barrier layer on the insulating layer; and
supplying oxygen ions to the barrier layer to form a second high-k dielectric layer on the insulating layer.

* * * * *